US006958255B2

(12) United States Patent
Khuri-Yakub et al.

(10) Patent No.: US 6,958,255 B2
(45) Date of Patent: Oct. 25, 2005

(54) MICROMACHINED ULTRASONIC TRANSDUCERS AND METHOD OF FABRICATION

(75) Inventors: Butrus T. Khuri-Yakub, Palo Alto, CA (US); Yongli Huang, San Jose, CA (US); Arif S. Ergun, Mountain View, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 10/638,057

(22) Filed: Aug. 7, 2003

(65) Prior Publication Data

US 2004/0085858 A1 May 6, 2004

Related U.S. Application Data

(60) Provisional application No. 60/402,220, filed on Aug. 8, 2002.

(51) Int. Cl.$^7$ ............................................. H01L 21/00
(52) U.S. Cl. ............................. 438/48; 438/118; 438/50
(58) Field of Search ............................................. 438/22

(56) References Cited

U.S. PATENT DOCUMENTS

| 5,343,064 | A | * | 8/1994 | Spangler et al. ............ 257/350 |
| 5,706,565 | A | | 1/1998 | Sparks et al. |
| 5,870,351 | A | | 2/1999 | Ladabaum et al. |
| 5,894,452 | A | * | 4/1999 | Ladabaum et al. ......... 367/163 |
| 5,982,709 | A | | 11/1999 | Ladabaum et al. |
| 6,004,832 | A | | 12/1999 | Haller et al. |
| 6,036,872 | A | * | 3/2000 | Wood et al. ............... 216/2 |
| 6,430,109 | B1 | | 8/2002 | Khuri-Yakub et al. |

FOREIGN PATENT DOCUMENTS

| EP | 03-72583 A2 | 8/2002 |
| WO | WO 2004/016036 A3 | 8/2003 |
| WO | WO 2004/016036 A2 | 8/2003 |

OTHER PUBLICATIONS

Xuecheng Jin, Igal Ladabaum, Butrus T. Khuri–Yakub, "The Microfabrication of Capacitive Ultrasonic Transducers", Journal of Microelectromechanical Systems, vol. 7, No. 3, Sep. 1998, pp. 295–302.

Kurt Petersen, Phillip Barth, John Poydock, Joe Brown, Joseph Mallon Jr., Janusz Brysek, "Silicon Fusion Bonding For Pressure Sensors", TH215–4/88/0000, 1988 IEEE, pp. 144–147.

Michael A. Huff, Alex D.Nikolich, Martin A. Schmidt, "Design of Sealed Cavity Microstructures Formed by Silicon Wafer Bonding", Journal of Microelectromechanical Systems, vol. 2, No. 2, Jun. 1993, pp. 74–81.

Lalitha Parameswaran, Andrew Mirza, Wendy K. Chan, Martin A. Schmidt, "Silicon Pressure Sensors Using a Wafer–Bonded Sealed Cavity Process", Transducers '95, Eurosensors IX, The 8$^{th}$ International Conference on Solid–State Sensors and Actuators, and Eurosensors IX, Stockholm, Sweden, Jun. 25–29, 1995, pp. 582–585.

(Continued)

*Primary Examiner*—Thao P. Le
(74) *Attorney, Agent, or Firm*—Dorsey & Whitney LLP (57) ABSTRACT

There is described a micromachined ultrasonic transducers (MUTS) and a method of fabrication. The membranes of the transducers are fusion bonded to cavities to form cells. The membranes are formed on a wafer of sacrificial material. This permits handling for fusions bonding. The sacrificial material is then removed to leave the membrane. Membranes of silicon, silicon nitride, etc. can be formed on the sacrificial material. Also described are cMUTs, pMUTs and mMUTs.

11 Claims, 10 Drawing Sheets

OTHER PUBLICATIONS

Tetsuo Fujii, Yoshitaka Gotoh, Susumu Kuroyanagi, "Fabrication of Microdiaphragm Utilizing Wafer Direct Bonding", 91CH2817–5/91/000, 1991 IEEE, pp. 672–675.

Chad E. Statler, Elizabeth S. Olson, K.R. Farmer, Thomas G. Digges, Jr., "Design and Fabrication of a Miniature Pressure Sensor Head Using Direct Bonded Ultra–Thin Silicon Wafers", New Jersey Institute of Technology, Virginia Semiconductor, Inc., 0–7803–2985–6/96, 1996 IEEE, pp. 239–243.

Ulrich M. Gosele, ME. Reiche, Q. Y. Tong, "Wafer Bonding: An Overview", pp. 243–247.

S. Mack, H. Baumann, U. Gosele, "Gas Tightness of Cavities Sealed By Silicon Wafer Bonding", 07803–3744–1/97, 1997 IEEE, pp. 488–493.

Chang–Han, Nathan W. Cheung, "Fabrication of Silicon and Oxide Membranes Over Cavities Using Ion–Cut Layer Transfer", Journal of Microelectromechanical Systems, vol. 9, No. 4, Dec. 2000, pp. 474–477.

Igal Ladabaum, Xuecheng Jin, Gyongsok T. Soh, Abdullah Atalar, Butrus T. Khuri–Yakub, "Surface Micromachined Capacitive, Ultrasonic Transducers", IEEE Transactions on Ultrasonics, Ferroelectrics, and Frequency Control, vol. 45, No. 3, May 1998, pp. 678–690.s.

Jin, Xueching et al., "The Microfabrication of Capacitive Ultrasonic Transducers", *Journal of Microelectromechanical Systems*, vol. 7, No. 3, Sep. 1998, pp. 295–302.

* cited by examiner

FIG_1.1

FIG_1.2

FIG_1.3

FIG_1.4

FIG_1.5

FIG_1.6

FIG_1.7

FIG_1.8

FIG_1.9

FIG_2

FIG_3.1

FIG_3.2

FIG_3.3

FIG_3.4

FIG_3.5

FIG_3.6

FIG_3.7

FIG_4.1

FIG_4.2

FIG_4.3

FIG_5.1

FIG_5.2

FIG_5.3

FIG_5.4

FIG_5.5

FIG_5.6

FIG_6

FIG_7

FIG_8

FIG_9

FIG_10

FIG_11

FIG_12

FIG_13

FIG_14

FIG_15.1

FIG_15.2

FIG_15.3

FIG_15.4

MICROMACHINED ULTRASONIC TRANSDUCERS AND METHOD OF FABRICATION

RELATED APPLICATION

This application claims priority to U.S. Provisional Application Ser. No. 60/402,220 filed Aug. 8, 2002.

GOVERNMENT SUPPORT

This invention was made with Government support under Contract No. N00014-02-1-0007 awarded by the Department of the Navy ONR. The Government has certain rights in this invention.

BRIEF DESCRIPTION OF THE INVENTION

This invention relates generally to micromachined ultrasonic transducers (MUT) and more particularly to a method of fabricating micromachined ultrasonic transducers using wafer-bond technology and to the resultant MUTs.

BACKGROUND OF THE INVENTION

Ultrasonic transducers have been used in a number of sensing applications such as a medical imaging non-destructive evaluation, gas metering and a number of ultrasound generating applications such medical therapy, industrial cleaning, etc. One class of such transducers is the electrostatic transducer. Electrostatic transducers have long been used for receiving and generating acoustic waves. Large area electrostatic transducer arrays have been used for acoustic imaging. The electrostatic transducer employs resilient membranes with very little inertia forming one plate of an electrostatic transducers support above a second plate. When distances are small the transducers can exert very large forces. The momentum carried by approximately half a wavelength of air molecules is able to set the membrane in motion and vice versa. Electrostatic actuation and detection enables the realization and control of such membranes. Alternatively the membranes can be actuated using piezoelectric and magnetic transducers.

Broad band microfabricated capacitive ultrasonic transducers (cMUTs) may include multiple elements including identical or different size and shape membranes supported above a silicon substrate by walls of an insulating material which together with the membrane and substrate define cells. The walls are formed by micromachining a layer of insulation material such as silicon oxide, silicon nitride, etc. The substrate can be glass or other substrate material. The capacitive transducer is formed by a conductive layer or the membrane and conductive means such as a layer either applied to the substrate or the substrate having conductive regions. In other types of broadband ultrasonic transducers in which the membranes are actuated by piezoelectric transducers (pMUTs) the cell walls need not be made of insulating material.

The fabrication of capacitive micromachined ultrasonic transducers has been described in many publications and patents. For example U.S. Pat. Nos. 5,619,476; 5,870,351 and 5,894,452, incorporated herein by reference, describe the fabrication of capacitive or electrostatic type ultrasonic transducers in which the membranes are supported above a substrate such as silicon by insulative supports such as silicon nitride, silicon oxide or polyamide. The supports engage the edges of each membrane to form a cell or cells. A voltage applied between the substrate and conductive film on the surface of the membranes causes the membranes to vibrate and emits sound, or in the alternative, received sound waves cause the membranes to vibrate and provide a change in capacitance. The membranes can be sealed to provide operation of the transducers immersed in liquids. Generally the transducers include a plurality of cells of the same or different sizes and/or shapes. In some applications the multi-cell transducer elements are disposed in arrays with the electrical excitation of the elements controlled to provide desired beam patterns. The same technology can be employed to fabricate pMUTs and mMUTs.

Generally the membranes in the prior art cMUTs are grown or deposited on an insulating film and the insulating film is selectively etched through openings in the membrane to provide underlying cavities. Membrane properties which depend upon the process parameters and the predictability, reproducibility and uniformity of the membranes are compromised. Further the formation of membranes with underlying cavities requires complex processing steps. Furthermore it is difficult to generate complex cavity membrane structures using the conventional MUT fabrication technology of the prior art.

OBJECTS AND SUMMARY OF THE INVENTION

It is a general object of the present invention to provide a method of fabricating micromachined ultrasonic transducers by employing fusion wafer bonding technology.

It is another object of the present invention to provide a method of fabricating MUTs with cells having fusion bonded membranes having prescribed properties.

It is a further object of the present invention to provide MUTs with membranes made of single crystal silicon whose mechanical properties are well known and do not depend on process parameters.

It is another object of the present invention to provide a method of fabricating MUTs in which the membrane is formed from the silicon on a silicon-on-insulator (SOI) wafer.

It is a further object of the present invention to provide a method of fabricating MUTs in which the shape and size of the membrane are defined by photolithography techniques which allows the building of membranes of virtually any size and shape.

It is a further object of the present invention to provide a method of fabricating MUTs with single crystal membranes having regions of different thickness.

There is provided a method of fabricating MUTs which employs photolithographic definition and etching of an oxide layer to define cavity size and shapes of the MUT cells, fusion bonding of the silicon side of a silicon-on-insulator wafer, the oxide layer and a support wafer, removal of the back side and the oxide layer of the silicon-on-insulator wafer to form a silicon membrane and to MUTs which include as a membrane the silicon layer of an SOI wafer.

There is provided a method of fabricating MUTs having cells with membranes supported by a substrate which employs photolithographic definition and etching to form cell walls of selected shape and cavity size, providing a wafer which includes a layer of material which is to form the membrane and fusion bonding the layer to the cell walls and a support substrate, removing the wafer to leave the layer of material to form the membrane whereby to form walls defined by the membrane, cell walls and the substrate.

There is provided a method of fabricating cMUTs comprising selecting a silicon wafer and a silicon-on-insulator wafer, forming a thermal oxide layer of predetermined thickness on the silicon of the wafer or on the silicon of the SOI wafer, defining the shape and size of the cavity by selectively removing the thermal oxide by photolithography and etching, fusion bonding the wafers and removing the insulator and oxide from the silicon-on-insulator wafer to leave the silicon layer to form a membrane supported on the patterned oxide.

There is provided a capacitive micromachined ultrasonic transducer in which the transducer membrane comprises the silicon layer of a silicon-on-insulator wafer.

BRIEF DESCRIPTION OF THE DRAWINGS

The foregoing and other objects of the invention will be more clearly understood from the following description when read in conjunction with the accompanying drawings of which:

FIGS. 1.1 through 1.9 illustrates the steps of forming a cMUT in accordance with one embodiment of the present invention;

FIGS. 3.1 through 3.7 illustrates the steps in forming a cMUT in accordance with another embodiment of the present invention;

FIGS. 4.1 through 4.3 illustrates the steps in forming a cMUT in accordance with still a further embodiment of the present invention;

FIGS. 5.1 through 5.6 illustrates the steps in forming a cMUT including a membrane having portions of different thicknesses in accordance with still another embodiment of the present invention;

FIG. 10 illustrates a cMUT in accordance with still another embodiment of the present invention;

FIG. 11 illustrates a pMUT fabricated in accordance with another embodiment of the present invention;

FIGS. 12 and 13 illustrates mMUTs fabricated in accordance with another embodiment of the present invention;

FIG. 14 schematically illustrates the formation of a then layer which serves as a membrane for fusion bonding in accordance with the present invention; and FIGS. 15.1–15.4 illustrates the steps of forming another membrane for fusion bonding in accordance with the present invention.

DESCRIPTION OF PREFERRED EMBODIMENT(S)

The fabrication of cMUTs having silicon membranes formed by fusion bonding of silicon-on-oxide wafers to silicon oxide cell wall is first described followed by a description of use of the same technology to form pMUTs and mMUTs. This is followed by a description of using the same fusion bonding process to fabricate other types of membranes having selected characteristics.

Figure 19:
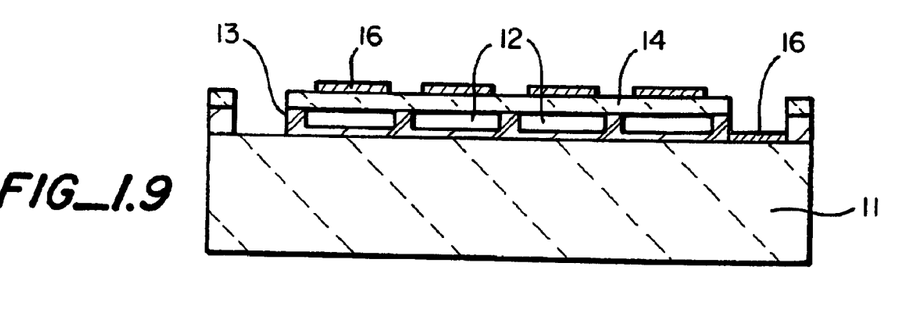
Figure 31:
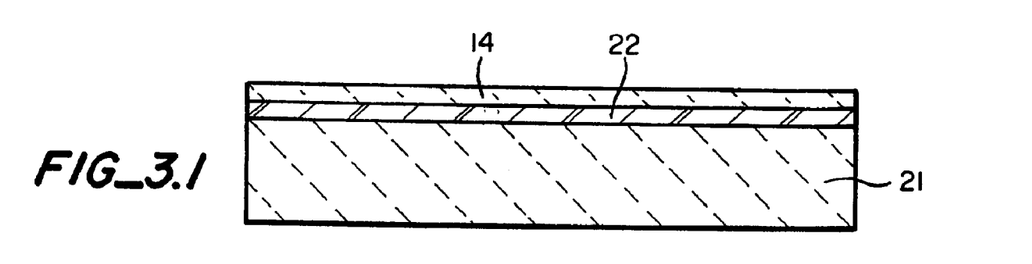
Figure 32:
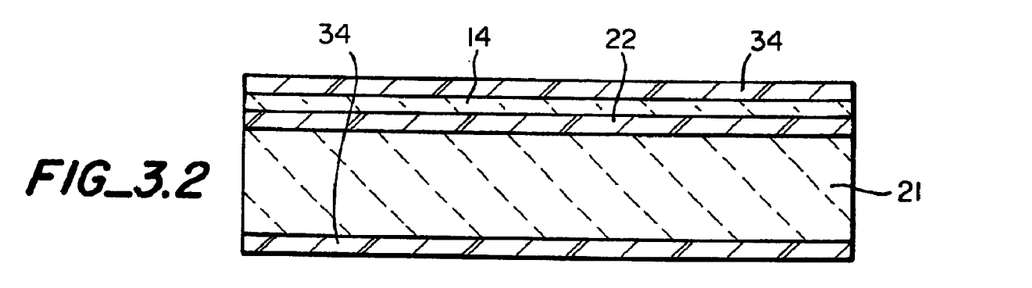
Figure 33:
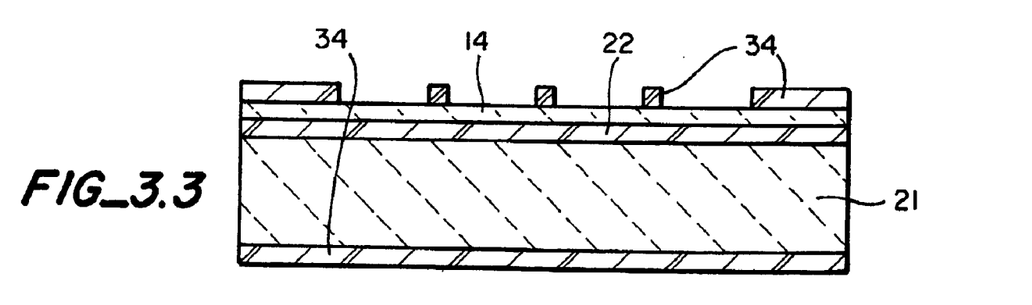
Figure 34:
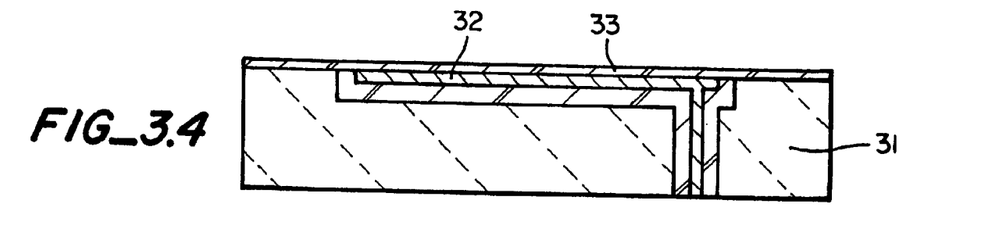
Figure 35:
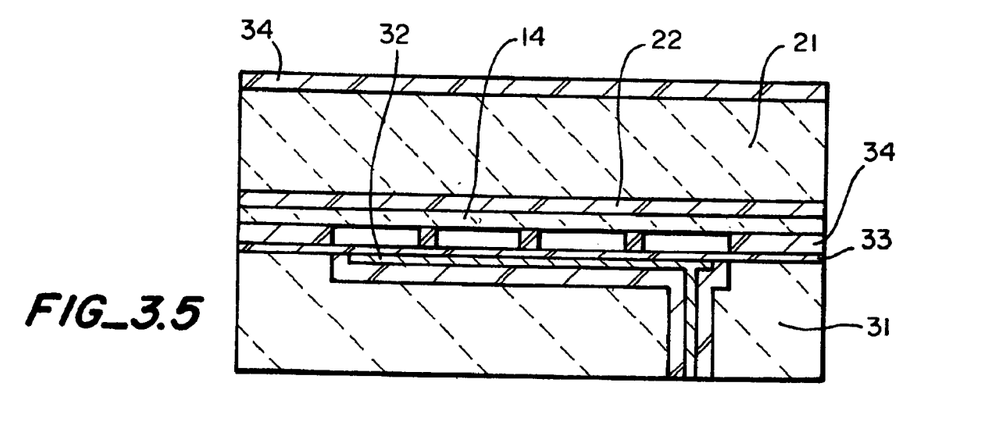
Figure 36:
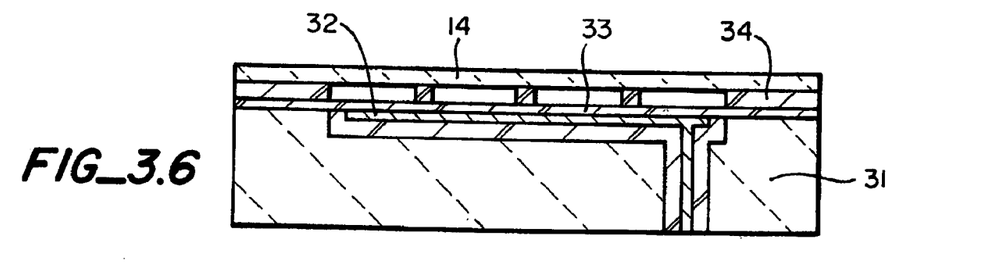
Figure 37:
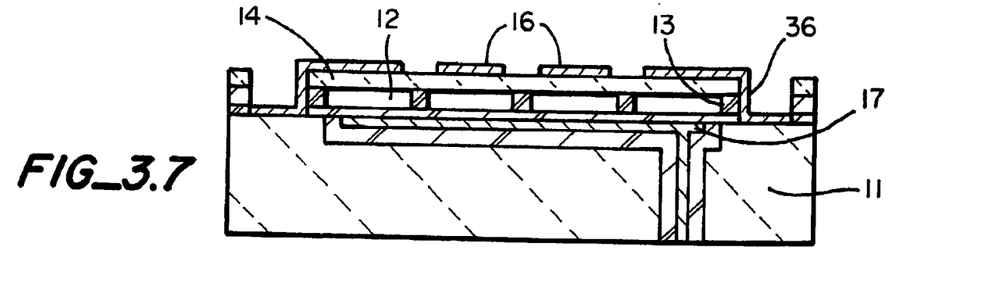
Figure 41:
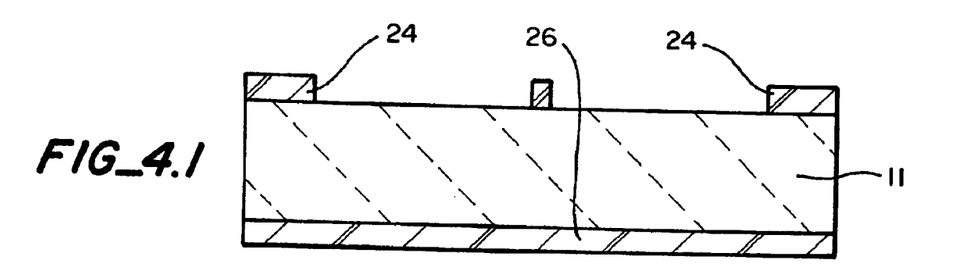
Figure 42:
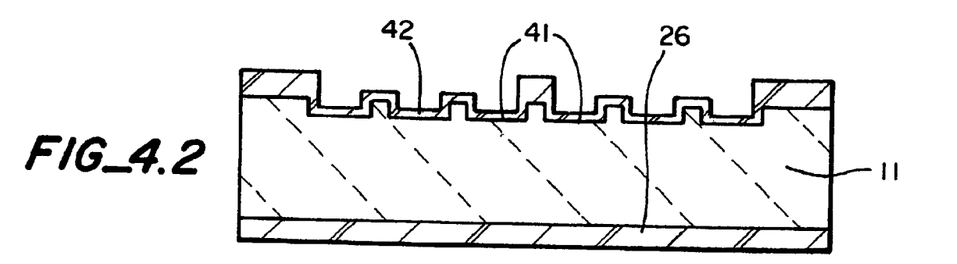
Figure 43:
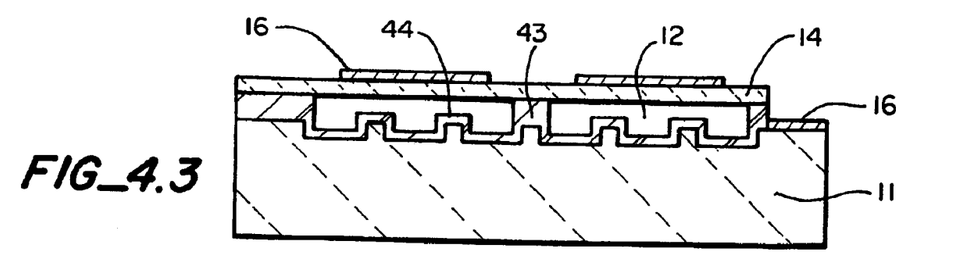

Referring to FIGS. 1.9 and 3.7, cMUTs in accordance with the present invention include cells on a support wafer 11 with a plurality of cells 12 having oxide walls 13 and silicon membranes 14 formed by fusion bonding of the silicon of a silicon-on-oxide wafer to the oxide walls. Conductive electrodes comprise the wafer 11 and the conduction layers 16 (FIG. 1.9). In FIG. 3.7 where like parts are represented by the same reference numbers the electrodes comprise the implanted region 17 and the conductive layers 16.

The steps of forming cMUTs in accordance with FIG. 1.9 employ fusion wafer bonding under vacuum are illustrated and described with reference to FIGS. 1.1 through 1.9. The process starts with two wafers. The first wafer 11 is a prime quality silicon wafer which is called a carrier wafer (FIG. 1.1). This wafer will make up the bottom electrode of the cMUTs. It can be a low resistivity wafer which makes it a conductive backplate or it can be a high resistivity wafer and doped selectively to define a patterned back electrode. The second wafer is a silicon-on-insulator (SOI) wafer as illustrated in FIG. 1.5. The silicon thickness of the SOI wafer will determine the membrane thickness. The SOI wafer includes a silicon support wafer 21, an oxide layer 22 and the silicon layer 14 which forms the cMUT membranes. The SOI wafer is chosen to meet the design requirements for thickness and characteristics of the membrane.

Figure 2:
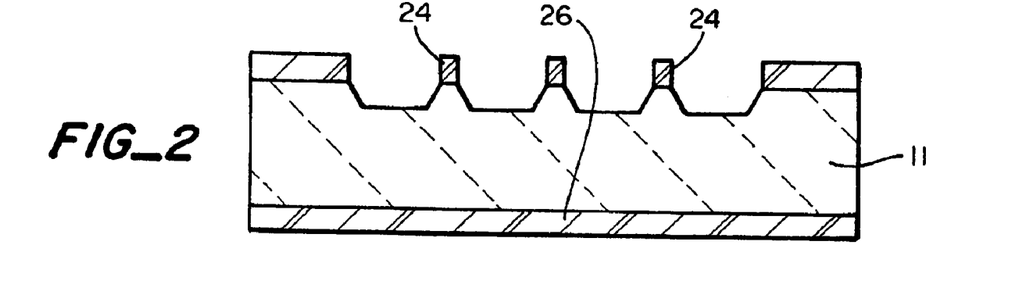
FIG. 2 is a sectional view illustrating an alternative embodiment of the processed wafer of FIG. 1.3.

The first steps are to define cavity size and shape. First the carrier wafer is thermally oxidized to form oxide layers 24 and 26 (FIG. 1.2). The thermal oxide thickness determines the cavity height of the cMUT. It is chosen to meet the design requirements. A photolithography step forms a suitable mask with openings defining the cavity shape. This is followed by an etch step such as a plasma etch to define the cavity. It is apparent that the cavities can be of virtually any size and shape (FIG. 1.3). The dry etching of the silicon dioxide layer stops at the silicon wafer so that the cavity depth is determined by the initial thermal of oxide. If it is desired to have deeper cavities, an additional silicon etch (dry or wet) can be used to define a deeper cavity if needed as illustrated in FIG. 2. In order to establish an electrical isolation between the bottom electrode and the top electrode (the SOI silicon) a thin layer of oxide 27 is thermally grown on the carrier wafer as shown in FIG. 1.4. This prevents possible shorts and device failure if the membrane is collapsed to a point where it contacts the bottom of the cavity.

The next step is to form the cMUT membrane. The SOI wafer is placed over the carrier wafer with the thin silicon layer 14 facing the carrier wafer, FIG. 1.6. The two wafers are then bonded by fusion wafer bonding under vacuum. If the bonding is done under very low pressure, the formed cavities or cells are vacuum sealed. Following this step the thick silicon portion 21 of the SOI support wafer on the back side and the oxide layer 22 are removed, FIG. 1.7. This can be done by a grinding and etching process whereby only the thin silicon layer which forms the membrane over the cavities remains, FIG. 1.7. The oxide layer 26 on the carrier wafer is also removed. The next step is to form the top electrodes. However, prior to the electrode formation another photolithography and dry etch sequence can be performed. With this step the top silicon and oxide layers around the periphery of the device are removed as shown in FIG. 1.8. There are two reasons for this, one is to isolate individual elements electrically from neighboring elements in an array. The other reason is to make electrical contact to the carrier wafer which makes up the bottom electrode of the cMUT. A thin layer of metal 16 is then deposited over the membrane to make up the top electrode, FIG. 1.9. The top electrode can be patterned by photolithography and etch sequences to reduce parasitic capacitance. Thus there are formed cMUTs having evacuated cells or cavities with a single crystal silicon membrane whose thickness and characteristics can be controlled by controlling the fabrication of the SOI wafer.

Using the fusion wafer bonding techniques and SOI wafers, cMUTs with electrical through wafer interconnects can be fabricated. In this embodiment the carrier wafer is processed to provide through wafer interconnects. A wafer with through wafer interconnect is illustrated in FIG. 3.4. The wafer is preprocessed with the electrical through wafer interconnect technology so that the electrical connections, both signal and ground, of the front side pads have connections on the back side of the carrier wafer. Briefly, the interconnect wafer includes a body of high resistivity silicon 31 into which have been implanted N type and P type regions forming a pn junction 32, a thermal oxide layer 33 is grown for isolation. The wafer with through wafer interconnects could be processed in the same manner as the wafer of FIG. 1.1 to define the cavities having silicon oxide walls onto which is fusion bonded the SOI wafer. However, a totally different process can be practiced for forming the device shown in FIG. 3.6. The SOI wafer of FIG. 3.1 including a back support 21, oxide layer 22 and silicon layer is thermally oxidized, FIG. 3.2, with the resulting silicon oxide layer 34 with thickness which determines cavity depth. The initial SOI wafer and the thermal oxidation conditions are chosen to meet the design requirements for membrane thickness and characteristics and cavity depth. A photolithography and dry etch sequence follows the thermal oxidation step to define the cavity shape and size which is equivalent to the membrane shape and size, FIG. 3.7. The formation of membrane is very similar to the one described above. The SOI wafer and carrier wafer are fusion bonded, FIG. 3.5, using fusion bonding techniques under low pressure resulting in vacuum sealed cavities. The back of the SOI wafer is ground and etched away to remove the silicon and silicon dioxide layers 21, 22 leaving a thin layer of silicon which forms the membrane of the capacitive micromachined ultrasonic transducer. This is followed by a metallization step which is slightly different from the one described above. In this case the top electrode serves as the ground and is therefore connected to the silicon substrate of the carrier as shown at 36 in FIG. 3.7. In the case of two-dimensional cMUT arrays for which the electrical through wafer interconnect are most relevant the top electrode is the ground electrodes and connects all the array elements. On the other hand, the signal electrode of each element is individually brought back to the back side of the carrier wafer through the electrical through wafer interconnects. It is apparent from the foregoing two processes that the size and configuration is determined by photolithographic steps the cavity depth by oxide thickness and etching, and the membrane characteristics by the thin silicon layer of the SOI wafer. In all instances the cavities are vacuum sealed and the cMUT is operable both in air and in submersion applications.

The wafer bonding technology for fabricating cMUTs allows the design of complex cavities. In this way it is possible to solve some of the problems associated with cMUTs. The following is one variation of the wafer bonding technology to create a complex cavity structure with non-bonded posts which may be used in various applications. For example it may be used to solve the big deflection and stiffening problem due to large initial pressure loads for cMUT applications in the low frequency range. Referring to FIG. 4.1, the starting materials are the same as used in connection with the embodiment of FIGS. 1.1 through 1.9. The first part of the cavity definition is the one described with regard to FIG. 1.3 (FIG. 4.1). Another photolithography a dry silicon etch step is used to define a second cavity structure 49 inside of the first cavity as shown in FIG. 4.2. A short thermal oxidation step follows to create a thin layer of oxide 42 on the silicon to establish an electrical isolation between the bottom and top electrodes. Membrane formation and electrode definition is identical to that described with regard to FIGS. 1.5 through 1.9 and results in the device of FIG. 4.3 which shows supporting oxide posts 43 and non-bonded post 44.

Figure 51:
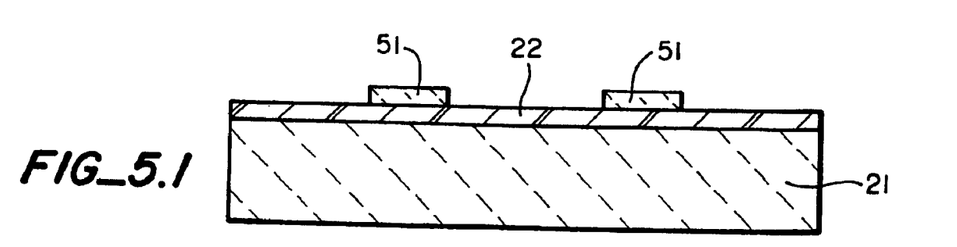

As is apparent from the foregoing, in cMUT transducers the membranes are supported from their edges. That is, the edges of the membranes are clamped and therefore do not move. As one goes toward the center of the membrane, the movement in response to actuation voltages increases. In other words the edges of the membrane do not contribute to the radiated pressure as much as the center which actually means a loss of efficiency. Using the flexibility of the wafer bond technology, cMUTs can be designed with piston-like movements which results in increased efficiency. This is achieved by putting an extra mass at the center of the membrane. Moreover, in a usual cMUT membrane thickness is uniform through the membrane, which determines both the spring constant and the mass. There are two critical parameters that determine the mechanical response of the cMUT. By using wafer bond technology to fabricate cMUTs, one can put extra mass at the center of the membrane and adjust the spring constant and the mass of the membrane independently. For a fixed design frequency one can select different effective mass and spring constants selection of the location of the piston part one can manipulate the harmonic response of the cMUT. The process flow illustrated in FIGS. 5.1 through 5.7 illustrate methods of fabricating cMUTs with piston-like membranes.

Figure 52:
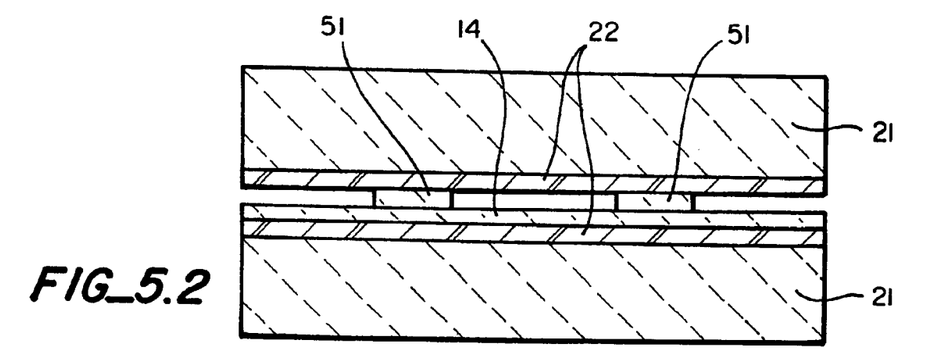
Figure 53:
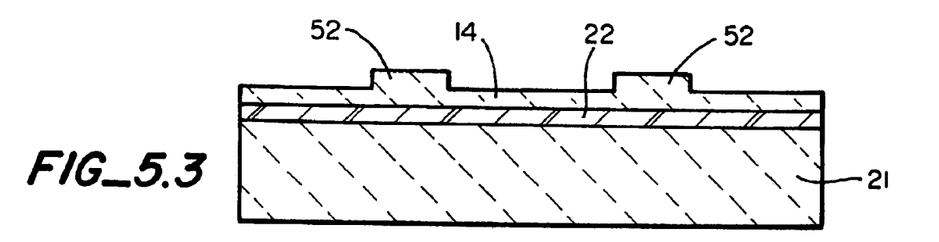
Figure 54:
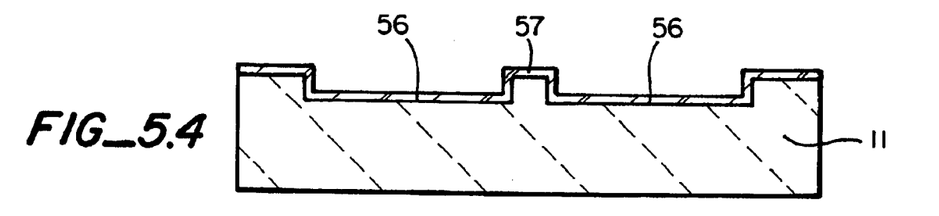
Figure 55:
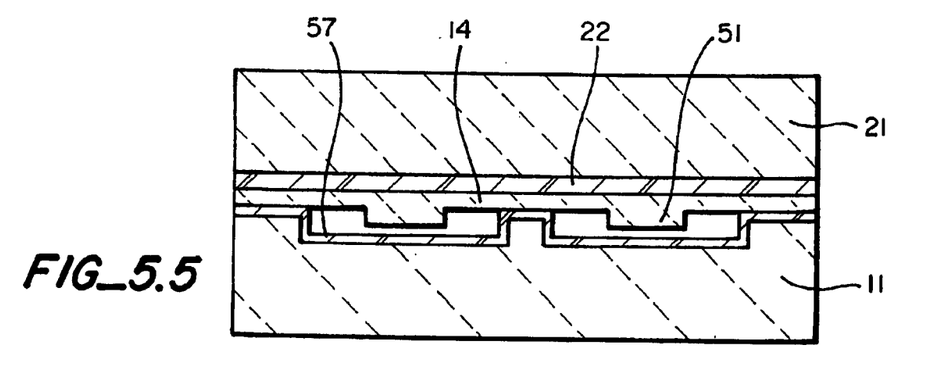
Figure 56:
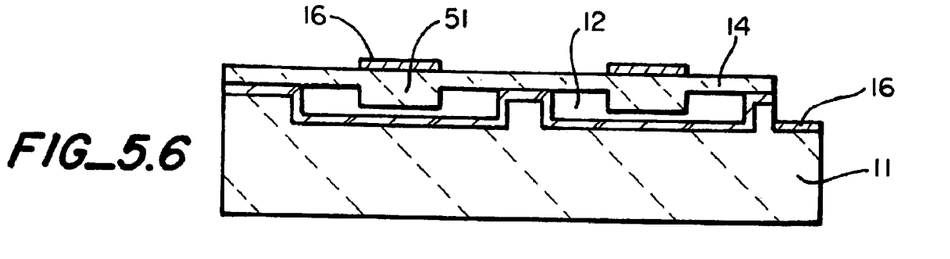
Figure 151:
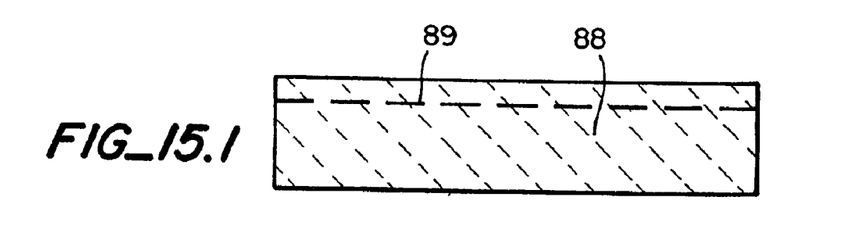
Figure 152:
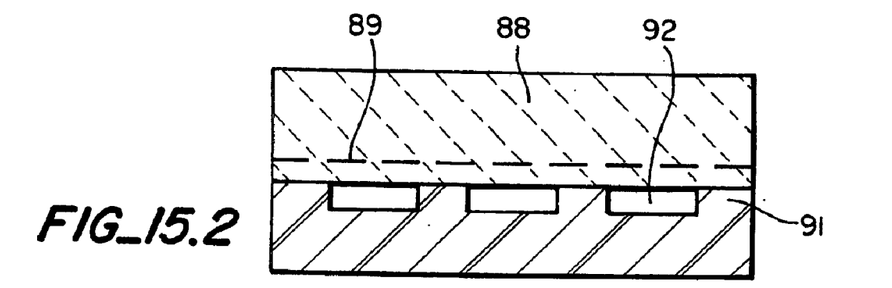
Figure 153:
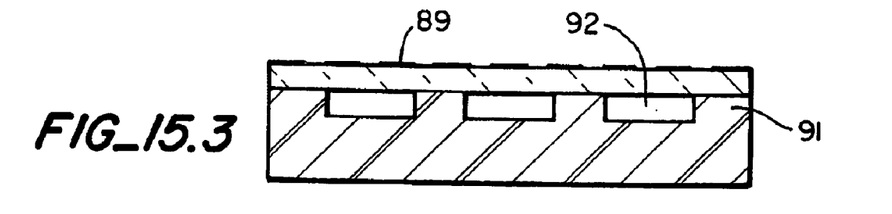
Figure 154:
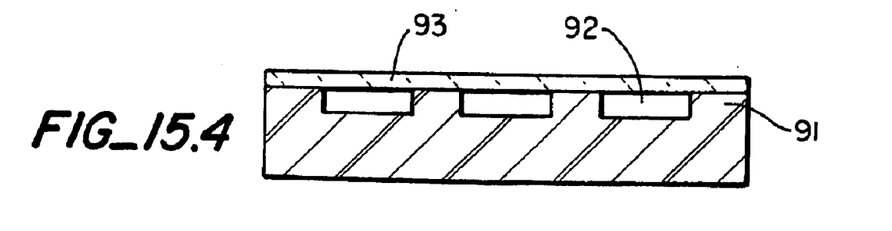

In fabricating a device one starts with two SOI wafers and a prime quality silicon wafers. The first step is to define the extra mass 51. For this purpose the first SOI wafer is patterned with a photolithographic and dry etch sequence which defines the extra mass areas 51 which will stick to the membrane, FIG. 5.1. In this step the thin silicon layer of the SOI wafer is selectively etched to leave regions or islands of predetermined shape, size and thickness to meet the design requirements for the added mass to be introduced to the membrane. This wafer is then fusion bonded to the second SOI wafer as illustrated in FIG. 5.2. The support portion, an oxide of the first SOI wafer, is ground and etched away, leaving leaving an SOI wafer with extra mass of silicon 52 on the silicon layer 14 of the second SOI wafer. FIG. 5.3.

The prime quality carrier silicon wafer 11 is thermally oxidized to define the cavity 56 depth and the cavity shape and size are defined photolithographically and dry etch sequence removes the exposed oxide. The cavity 56 depth must be larger than the thickness of the extra mass on the thin silicon layer of the SOI wafer. Depending on the design, thermal oxidation may not be enough to define the cavity depth, and a further silicon etch may be required as illustrated in FIG. 2. The carrier wafer is then thermally oxidized 57 again to grow the thin layer of silicon dioxide for electrical isolation purposes, FIG. 5.4. The carrier wafer and the SOI wafer with the extra silicon mass on the thin silicon layer are fuse bonded under vacuum as illustrated in FIG. 5.5. The extra masses 51 on the SOI wafer are aligned with the cavities 56 on the carrier wafer. The handle portion or the support portion of the SOI wafer together with the silicon dioxide is removed by grinding and etching, leaving the silicon membrane with extra silicon masses and vacuum sealed cavities such as shown in FIG. 5.6 which also shows the application of electrodes by following the steps of isolation and electrode definition described in relation to FIGS. 1.8 and 1.9. The cMUT includes membrane 14 with extra mass 51, cavities 12, and electrodes 16. Alternatively, the oxide can be formed on the silicon of the SOI wafer as in the process of FIG. 3.

Figure 6:
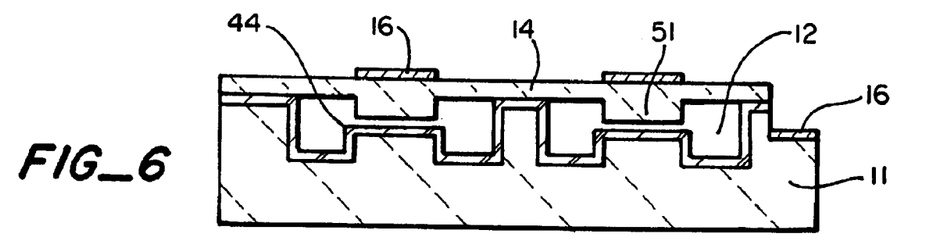
FIG. 6 illustrates a cMUT in accordance with a further embodiment of the invention.
Figure 7:
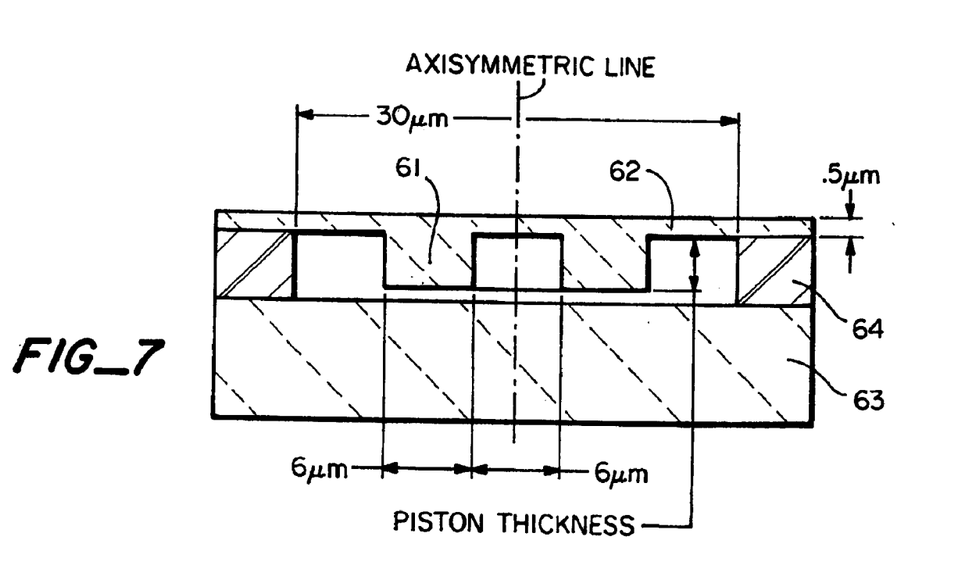
FIG. 7 illustrates a cMUT in accordance with another embodiment of the present invention.
Figure 8:
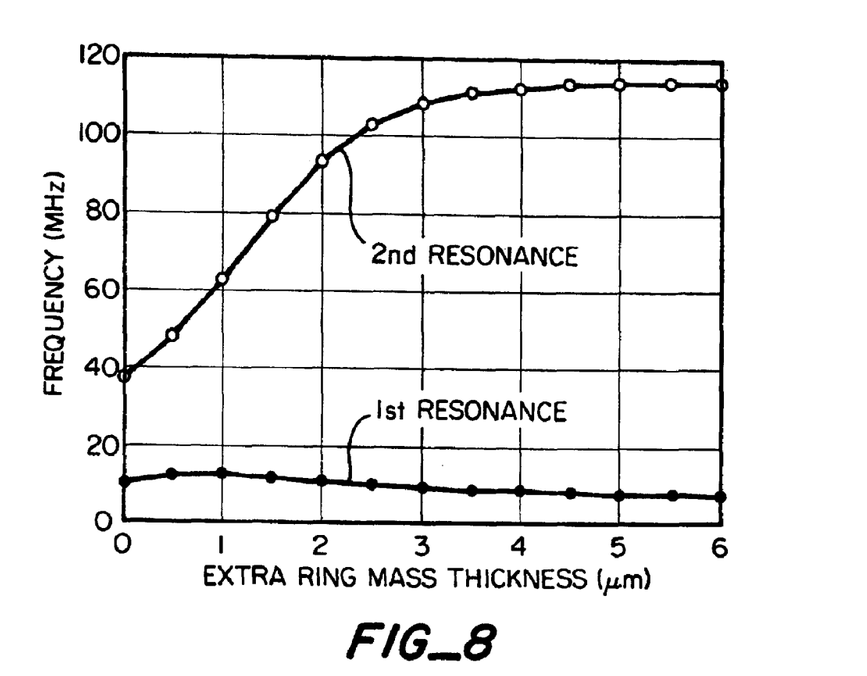
FIG. 8 illustrates the first and second resonant frequencies in air as a function of the extra mass on the membrane of FIG. 7.
Figure 9:
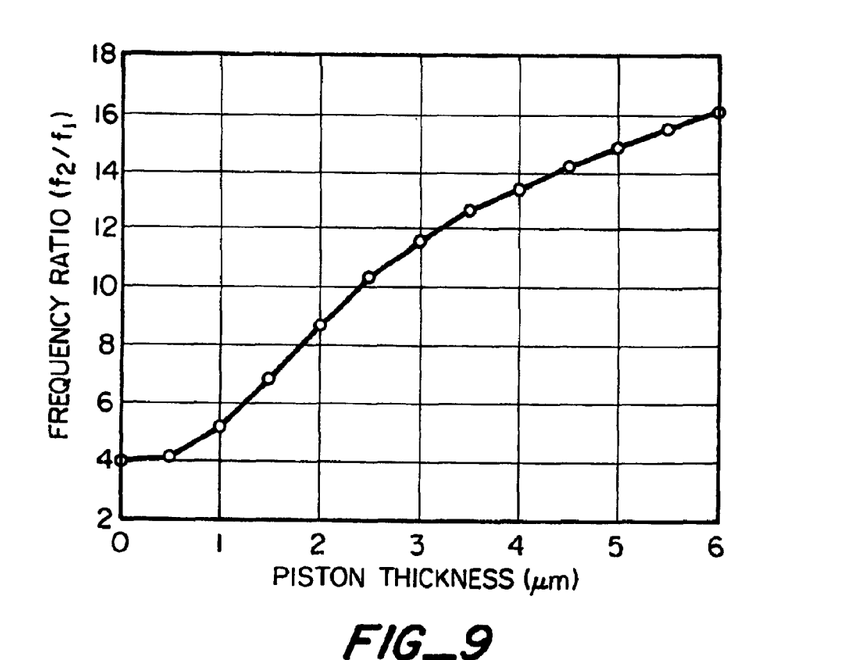
FIG. 9 illustrates the ratio of the first and second resonance frequencies of FIG. 8.

By combining complex cavity structures such as those described with regard to FIG. 4 and membranes with extra masses as described in relation to FIG. 5, one can achieve all the advantages of both. Such a device is illustrated in FIG. 6 where like reference numbers are applied to like parts.

cMUTs are resonant structures in air with a fairly high quality factor. However, in immersion the acoustic impedance of the medium dominates the mechanical impedance of the cMUT, resulting in a very broad band operating frequency. Over 100% bandwidth are typical with cMUTs. It is possible to increase the bandwidth of the cMUTs further by using an extra mass underneath the membrane which is made possible with the foregoing described wafer bonding technology. In immersion the lower end of the frequency response of the cMUT is determined by the overall size of the transducer. When the frequency becomes so low the device is much smaller than a wavelength, the output pressure of the cMUT drops. The higher end of the cMUT's frequency response is limited by the second resonance of the membranes. By pushing the second resonance of the cMUT membranes at the higher frequencies it is possible to increase the bandwidth. For example an extra mass defined in the shape of a ring 61 formed on the membrane 62 supported on the carrier wafer 63 by oxide layer 64. The dimensions are shown in FIG. 7 for one example. FIG. 8 shows a plot of the first two resonant frequencies of the membrane shown in FIG. 7 as a function of thickness of the mass. FIG. 9 is a plot of the ratio of the two frequencies showing a definite increase in second resonance frequency with respect to the first.

Figures 10, 11:
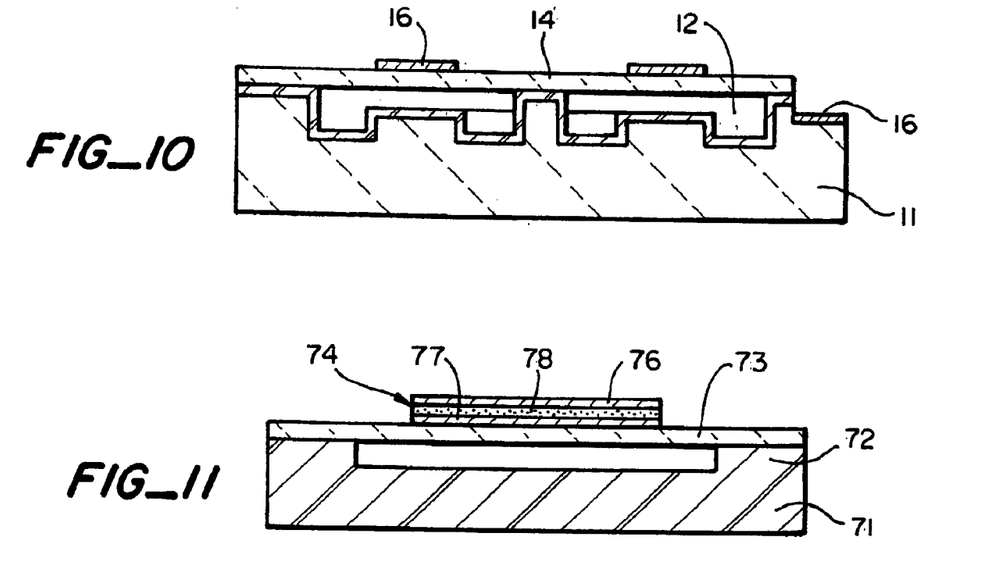
Figure 11:
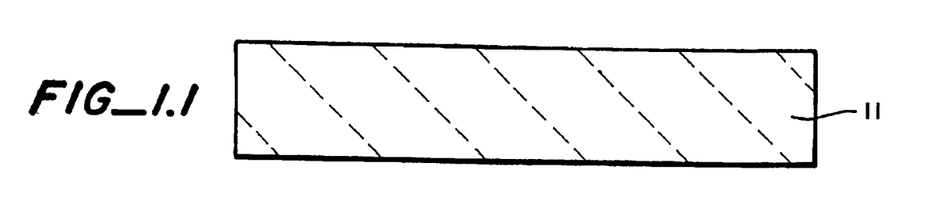

The method of creating complex cavity structures described with regard to FIG. 4 can be used to address other problems. Instead of posts inside the cavity, pistons can be created as shown in FIG. 10. One of the problems this structure can bring solution to is the parasitic capacitance. In a cMUT any non-moving capacitance, and any fringing capacitance is considered as a parasitic capacitance because they neither generate or detect any acoustic waves. Normally the top electrode is patterned to reduce the parasitic capacitance by minimizing the metallization area over the non-moving region. The bottom electrode can be patterned too, to decrease the parasitic capacitance further. But still there will be unavoidable fringing capacitance. Using the wafer bonding technology to make cMUTs, one can design and master the cavity shape to minimize fringing fields which would further improve the performance of a cMUT.

Figure 12:
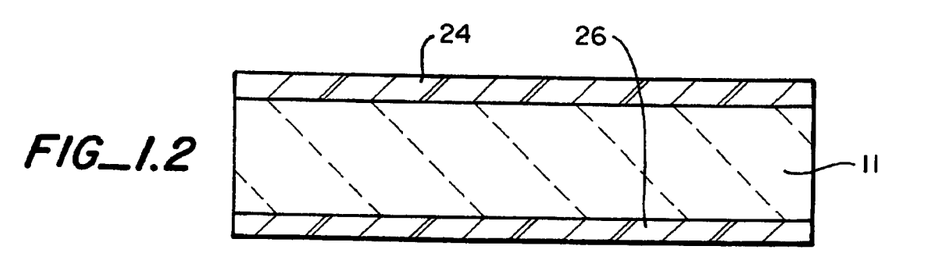
Figure 13:
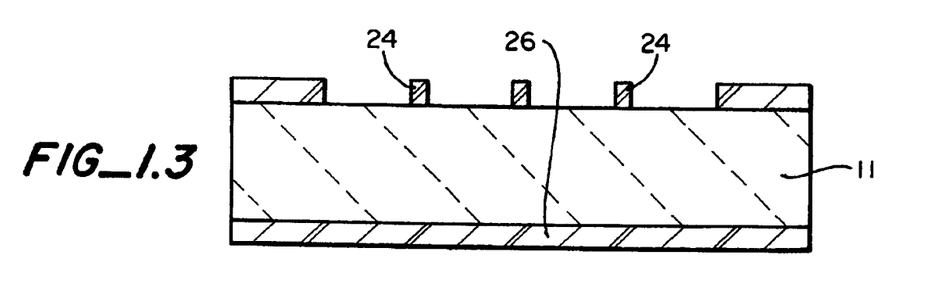
Figure 14:
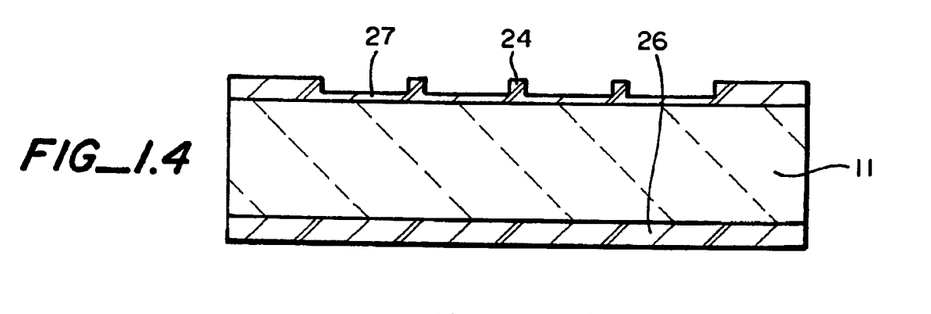
Figure 15:
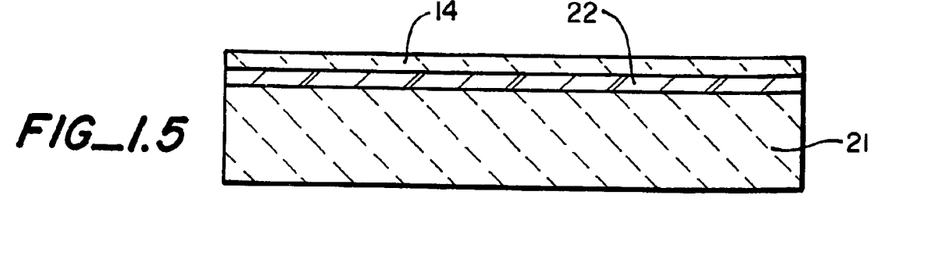
Figure 16:
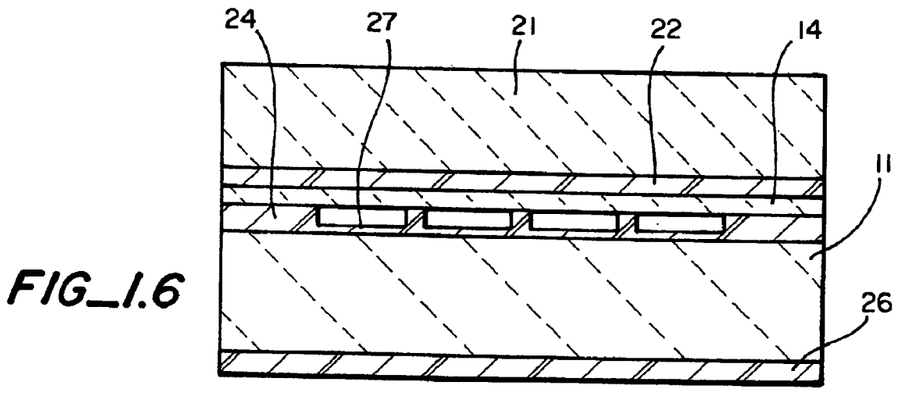
Figure 17:
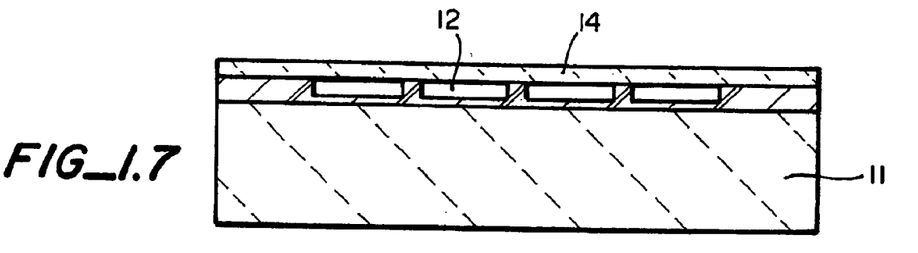
Figure 18:
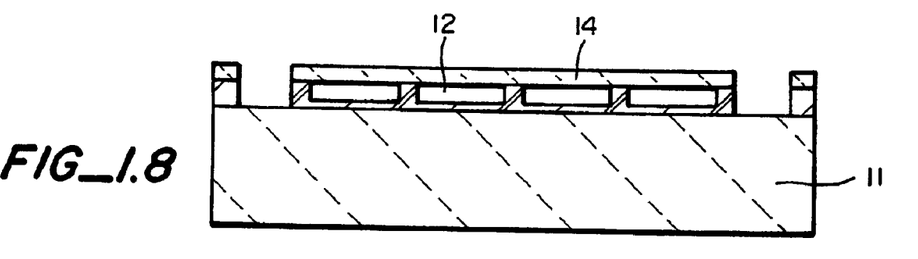

As briefly described above, the same fusion bonding process can be employed to fabricate pMUTs and mMUTs. Rather than applying a conductive layer to form cMUTs, FIGS. 1.9, 3.7, 4.3, 5.6, 6 and 4, one may form a piezoelectric transducer or a magnetic transducer on the membrane. This is schematically illustrated in FIGS. 11, 12 and 13 for a single cell. Referring to FIG. 11, the cell includes a substrate 71 which is micromachined to form cell walls 72. The cell walls can also be formed by micromachining oxide or other layers. The membrane 73 is fusion bonded to the walls and piezoelectric transducer 74 is deposited onto the membrane. The transdcuer includes metal electrodes 76, 77 and piezoelectric material 78. A voltage applied between the electrodes generates stress in the piezoelectric material and vibrates the membrane to generate acoustic waves. Stress in the piezoelectric material is measured acoustic waves received by the pMUT.

In FIGS. 12 and 13 like reference numerals have been applied to parts like those of FIG. 11. FIG. 12 shows a coil 81 on the membrane 73 while FIG. 13 shows a magnetic material 82 on the membrane 73. The membrane is vibrated by magnetic fields 83 to generate acoustic waves or vibration of the membrane is magnetically sensed.

Although silicon membranes fabricated by fusion bonding silicon-on-oxide wafers to form cells has been described, the fusion bonding of membranes of other materials can be implemented. For example the membrane may be formed by depositing or epitaxially growing a film of material 86 (e.g. $Si_x$, $N_x$, SiI, etc.) onto a carrier wafer 87 of sacrificial material, FIG. 14, which can be removed after the film or layer has been fusion bonded to form the cell membrane. In the alternative the membrane can be defined by fusion bonding a wafer of desired material and then removing wafer material by etching, grinding and polishing to leave a membrane of desired thickness.

In a further method a wafer 88 FIG. 15.1, of the desired membrane material is implanted to form a highly stressed interface 89 and fusion bonded to the walls 91 of cells 92, FIG. 15.2. The assembly is then subjected to a thermal cycle (shock) to separate the thin layer of stressed material from the bulk, FIG. 15.3, and then fine polished, FIG. 15.4, leaving MUTs with a membrane 93 of selected material and characteristics.

Thus there have been provided MUTs having a membrane whose thickness and characteristics can be closely controlled to provide increased predictability, uniformity and repeatability of MUT devices. Furthermore, MUT devices can be configured to provide enhanced operation such as improved acoustic characteristics and reduction of parasitic capacitance.

What is claimed is:

1. The method of fabricating a microfabricated ultrasonic transducer comprising the steps of:
   selecting a silicon carrier wafer;
   selecting a silicon-on-insulator wafer having a thin silicon layer supported on an oxide layer;
   thermally oxidizing either the silicon wafer or the silicon layer of the silicon-on-insulator wafer to form a silicon oxide layer of predetermined thickness;
   applying a mask having openings of predetermined size and shape, to expose areas of the oxide layer;
   etching away the oxide at the exposed openings to define oxide walls;
   bonding the two wafers with the thin silicon layer facing the silicon carrier wafer and spaced therefrom by the oxide layer whereby cells are formed; and
   removing the wafer and oxide layer of the silicon-on-oxide-on insulator wafer leaving the thin silicon membrane supported spaced from the silicon carrier wafer by the silicon oxide.

2. A method as in claim 1 in which the oxide layer is formed on the silicon carrier wafer.

3. The method of claim 1 in which the oxide is formed on the silicon layer of the silicon-on-oxide insulator.

4. The method as in claim 2 including the additional step of applying a thin oxide layer over the support oxide and carrier wafer prior to bonding.

5. The method of claim 3 including the steps of forming a thin oxide layer on the carrier wafer prior to bonding the wafers.

6. The method of claim 1 including the additional steps of selecting an additional silicon-on-insulator wafer having a thin silicon layer supported on an oxide layer;

masking an etching away portions of said thin silicon layer to leave islands of predetermined size and shape;

bonding said islands to the thin silicon of the silicon-on-insulator wafer;

removing the oxide and wafer to leave the selected wafer with a thin silicon layer having areas of different thicknesses whereby the resulting silicon membranes have areas of different thicknesses.

7. The method of claim 2 including the additional step of etching the carrier wafer between the oxide cavity walls to configure the bottom wall.

8. The method of claim 3 including the additional step of etching the carrier wafer between the oxide cavity walls to configure the bottom wall.

9. The method of forming an ultrasonic transducer the type comprising a membrane supported on a carrier wafer by patterned oxide supports of predetermined size and shape;

selecting a carrier wafer;

selecting a silicon-on-insulator wafer having a thin silicon layer supported by an oxide;

forming an oxide layer of predetermined thickness and by masking and etching removing the oxide layer from selected regions to provide wells having walls of predetermined size and shape;

bonding the carrier and silicon of the silicon-on-insulator wafer and the oxide walls; and removing the support oxide and wafer leaving the silicon layer to form membranes which defines cavities of predetermined size and shape.

10. The method of fabricating ultrasonic transducer cells which comprises the steps of:

selecting a substrate;

selecting a wafer including a thin membrane supported by a sacrificial material;

forming an oxide layer having windows on the thin membrane or on the substrate;

bonding the thin membrane, oxide layer and substrate to form cells at said windows; and removing the sacrificial material to leave the membrane supported spaced from the substrate.

11. The method of fabricating ultrasonic transducer cells which comprises the steps of:

selecting a substrate;

selecting a water including a thin membrane supported by a sacrificial material;

forming an oxide layer on the thin membrane or on the substrate;

removing by masking and etching selected portions of said oxide layer to form wells;

bonding the thin membrane, oxide layer and substrate to form cells; and removing the sacrificial material to leave the membrane supported spaced from the substrate.

* * * * *